United States Patent
Olivadese et al.

(10) Patent No.: US 10,971,672 B2
(45) Date of Patent: Apr. 6, 2021

(54) QUANTUM DEVICE WITH MODULAR QUANTUM BUILDING BLOCKS

(71) Applicant: International Business Machines Corporation, Armonk, NY (US)

(72) Inventors: Salvatore Bernardo Olivadese, Stamford, CT (US); Mark Ritter, Sherman, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/047,192

(22) Filed: Jul. 27, 2018

(65) Prior Publication Data
US 2020/0035902 A1    Jan. 30, 2020

(51) Int. Cl.
| | |
|---|---|
| *H01L 29/06* | (2006.01) |
| *H01L 39/04* | (2006.01) |
| *G06N 10/00* | (2019.01) |
| *H01L 39/02* | (2006.01) |
| *H01L 39/22* | (2006.01) |
| *H01L 39/24* | (2006.01) |

(52) U.S. Cl.
CPC .......... *H01L 39/045* (2013.01); *G06N 10/00* (2019.01); *H01L 39/025* (2013.01); *H01L 39/223* (2013.01); *H01L 39/2493* (2013.01)

(58) Field of Classification Search
None
See application file for complete search history.

(56) References Cited

U.S. PATENT DOCUMENTS

| | | |
|---|---|---|
| 5,263,620 A | 11/1993 | Hernandez et al. |
| 6,960,780 B2 | 11/2005 | Blais et al. |

(Continued)

FOREIGN PATENT DOCUMENTS

| | | |
|---|---|---|
| WO | 2016199029 A1 | 12/2016 |
| WO | 2017189053 | 2/2017 |

(Continued)

OTHER PUBLICATIONS

Gambetta et al., "Building logical qubits in a superconducting quantum computing system," Nature Partner Journals, Quantum Information, Jan. 13, 2017, 7 pages.

(Continued)

*Primary Examiner* — Hung K Vu
(74) *Attorney, Agent, or Firm* — Amin, Turocy & Watson, LLP

(57) ABSTRACT

Techniques for a quantum device with modular quantum building blocks are provided. In one embodiment, a device is provided that comprises a substrate that is coupled with a plurality of qubit pockets, where at least one qubit pocket of the plurality of qubit pockets is coupled with a qubit. In one implementation, the device can further comprise a plurality of connectors coupled to the substrate and positioned around at least a portion of the substrate, where the plurality of connectors comprising a connecting element. In one or more implementations, the device can further comprise a plurality of transmission lines formed on the substrate and connect at least one connector of the plurality of connectors to at least one qubit pocket of the plurality of qubit pockets.

12 Claims, 8 Drawing Sheets

(56) References Cited

U.S. PATENT DOCUMENTS

| | | |
|---|---|---|
| 9,379,303 B2 | 6/2016 | Gambetta et al. |
| 9,524,470 B1 | 12/2016 | Chow et al. |
| 9,727,527 B2 | 8/2017 | Maassen van den Brink et al. |
| 9,892,365 B2 | 2/2018 | Rigetti et al. |
| 2012/0326720 A1 | 12/2012 | Gambetta et al. |
| 2016/0204330 A1 | 7/2016 | Abraham et al. |
| 2016/0364653 A1* | 12/2016 | Chow ................... H01L 25/04 |

FOREIGN PATENT DOCUMENTS

| | | |
|---|---|---|
| WO | 2018063139 | 4/2018 |
| WO | 2018063139 A1 | 4/2018 |

OTHER PUBLICATIONS

Tinkham et al., "Introduction to Superconductivity," Second Edition, 1996, 472 pages.
International Search Report and Written Opinion for PCT/EP2019/069920 dated Oct. 29, 2019, 11 pages.

* cited by examiner

QUANTUM DEVICE WITH MODULAR QUANTUM BUILDING BLOCKS

BACKGROUND

The subject disclosure relates generally to devices used for quantum computing, more particularly, a quantum device implemented using modular quantum building blocks.

Supercomputers (e.g., quantum computers) are powerful machines capable of processing information substantially faster and more efficiently than general computers. Built on principles of quantum physics, quantum computing can execute new types of algorithms and process information more holistically than conventional computing systems. Quantum computers can be used for new drug discovery, optimization of man-made systems, artificial intelligence and a host of other applications.

Quantum computers are based on operation of qubits, which operate according to principles of quantum physics: superposition and entanglement. Superposition means that a qubit represents both values of 1 and 0 at the same time. Entanglement means that the qubits can be correlated with each other wherein the state of one qubit can depend on the state of another qubit. Using these principles, qubits can act as sophisticated switches. A single qubit can represent both values 0 and 1 simultaneously (or concurrently) and in combinations. Two qubits can represent four values simultaneously (or concurrently) (e.g., 00, 01, 10, 11). Similarly, three qubits can represent $2^3$ values and 50 qubits can represent $2^{50}$ values simultaneously (or concurrently).

Quantum computing is increasingly becoming popular and rapidly being deployed. In quantum computing, a quantum processor is used to process qubit information. To be scalable, the quantum processor must have an ability to correct errors. Due to high tolerance to error on the qubits, surface code error correction architecture is a leading solution. To implement surface code correction architecture, the quantum processor is designed to use a two-dimensional (2D) or a three-dimensional (3D) grid of qubits (e.g., superconducting qubits), wherein a grid may have two or more qubits neighboring each other. However, there are problems with using either 2D or 3D grid of qubits for a quantum processor. Over time, frequency collision and qubit deterioration can occur, which will impact performance of the quantum processor.

Frequency collision occurs when two or more neighboring (or adjacent) qubits end up with same frequency for communication. The system cannot control the frequency of the qubits because the thickness of the material used for substrate and type of material used to attach the qubit to the substrate control the frequency of the qubit. The problem is that when frequency collision occurs, the system cannot distinguish which qubit to use and thus, qubits with same frequency become unusable. Thus, the frequency collisions impact performance of the quantum processor.

Also, qubit deterioration occurs with prolong use of the quantum device. There may be several reasons why the qubits deteriorate. For example, when materials used for a substrate deteriorates or when a device that connects qubits to the substrate (e.g., Josephen junction that connects a qubit to the substrate deteriorates) deteriorates, the qubit becomes unusable (e.g., qubit deterioration). The current solution is to replace an entire quantum device when qubit(s) deteriorate.

Conventional systems do not adequately address the aforementioned issues. Some quantum device systems may use a flux tunable qubit, wherein the frequency of a qubit is changed by applying flux (e.g., a magnetic field). Applying magnetic field adds noise to other qubits causing inefficiencies to overall performance of the quantum device. Some schemes focus on improving materials used for connecting qubits to a substrate to prolong change in qubit frequency. However, such solution is inefficient, expensive and difficult to implement. For qubit deterioration, there are no known conventional solutions to eliminate deterioration of qubits. Most approaches suggest replacing an entire quantum device once performance of the quantum device falls below a threshold. None of the approaches individually or in combination suggest a viable solution to address frequency collision and deterioration of qubits.

SUMMARY

The following presents a summary to provide a basic understanding of one or more embodiments of the invention. This summary is not intended to identify key or critical elements, delineate scope of the embodiments or scope of the claims. Its sole purpose is to present concepts in a simplified form as a prelude to the more detailed description that is presented later. In one or more embodiments described herein, systems, methods, apparatus and/or computer program products that facilitate a quantum device with modular quantum building blocks.

According to an embodiment, a device is provided. In one example, the device comprises a substrate having a plurality of qubit pockets, where at least one qubit pocket of the plurality of qubit pockets is provided with a qubit. In one or more implementations, the device can further comprise a plurality of connectors coupled to the substrate and positioned around at least a portion of the substrate, where the plurality of connectors comprising a connecting element. In one or more implementations, the device can further comprise a plurality of transmission lines formed on the substrate and connect at least one connector of the plurality of connectors to at least one qubit pocket of the plurality of qubit pockets. An advantage of such device can be that the device contains connecting elements that allow implementation of a quantum device with modular quantum building blocks. A quantum device with modular quantum building blocks provides an ability to replace a single quantum building block over previous techniques.

In some examples, the plurality of connectors are arranged on the substrate with a separation gap to maintain crosstalk below a threshold. An advantage of arranging the connector in this manner allows use of various types of material to connect the quantum building blocks while maintaining crosstalk below a threshold.

In another embodiment, a method is provided. In one example, the method comprises providing a substrate with a plurality of qubit pockets. The method can further comprise providing at least one qubit pocket of the plurality of qubit pockets with a qubit. The method can further comprise coupling a plurality of connectors to the substrate and positioning the plurality of connectors around at least a portion of the substrate, where the plurality of connectors comprising a connecting element. The method can further comprise forming a plurality of transmission lines on the substrate and arranging the plurality of transmission lines to connect at least one connector of the plurality of connectors to at least one qubit pocket of the plurality of qubit pockets. An advantage of such method can be that it can be used to implement a quantum device with modular quantum building blocks that provide an ability to replace a single quantum building block over previous techniques.

In some examples, the method can further comprise arranging the plurality of connectors on the substrate with a separation gap between the plurality of connectors to maintain crosstalk below a threshold. An advantage of arranging the connector in this manner allows use of various types of material to connect the quantum building blocks while maintaining crosstalk below a threshold.

In another embodiment, a structure is provided that includes a device assembled with a plurality of quantum building blocks, where the plurality of quantum building blocks comprise a substrate, a plurality of connectors, a plurality of qubit pockets and a plurality of transmission lines. In one or more implementation, the structure can further comprise a plurality of connecting elements coupled to the plurality of connectors, wherein the plurality of connecting elements transport quantum signals between the plurality of quantum building blocks. An advantage of such structure can be that the structure contains connecting elements that allow implementation of a quantum device with modular quantum building blocks. A quantum device with modular quantum building blocks provides an ability to replace a single quantum building block over previous techniques.

In some examples, the plurality of connecting elements are arranged with a separation gap between the plurality of connecting elements to maintain crosstalk below a threshold. The advantage of arranging the connector in this manner allows use of various types of material to connect the quantum building blocks while maintaining crosstalk below a threshold.

In another embodiment, a method is provided comprises assembling a plurality of quantum building blocks comprising a substrate, a plurality of connectors, a plurality of qubits and a plurality of transmission lines. The method can further comprise determining resistance levels of the plurality of qubits to determine communication frequencies of the plurality of qubits. The method can further comprise forming a quantum device by modularly connecting the plurality of quantum building blocks and arranging the plurality of quantum building blocks such that communication frequencies of the plurality of qubits are different for the plurality of quantum building blocks. An advantage of such method can be that it can be used to determine communication frequencies and rearranging the quantum device to avoid frequency collisions. Also, another advantage of modularly connecting the quantum building blocks is that it provides an ability to replace a single quantum building block over previous techniques.

In some example, the method further comprises using a plurality of connecting elements arranged with a separation gap of at least three millimeters between the plurality of connecting elements. An advantage of arranging the connector in this manner allows for maintaining crosstalk below a threshold when the quantum building blocks are connected.

In another embodiment, a method is provided that comprises assembling a device with a plurality of quantum building blocks, wherein the plurality of quantum building blocks comprises a substrate, a plurality of connectors, a plurality of qubit pockets and a plurality of transmission lines. The method further comprises coupling a plurality of connecting elements to the plurality of connectors, wherein the plurality of connecting elements transport quantum signals between the plurality of quantum building blocks. An advantage of such method can be that it can be used to implement a quantum device with modular quantum building blocks that provide an ability to replace a single quantum building block over previous techniques.

In some examples, the method further comprises arranging the plurality of connecting elements with a separation gap between the plurality of connecting elements to maintain crosstalk below a threshold. The advantage of arranging the connector in this manner allows use of various types of material to connect the quantum building blocks while maintaining crosstalk below a threshold.

DETAILED DESCRIPTION

The following detailed description is merely illustrative and is not intended to limit embodiments and/or applications or uses of embodiments. Furthermore, there is no intention to be bound by any expressed or implied information presented in the preceding Summary section, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

Given the aforementioned issues with implementation of a quantum processor using a surface code error correction architecture in quantum computing, one or more embodiments can be implemented to produce a modular quantum device that provides a solution to one or more of those issues. The disclosed subject matter provides a quantum device, implemented using a modular array of multiple quantum building blocks. In some implementations, a quantum building block can be a substrate having L number of qubits (e.g., L can be total number of qubits divided by number of quantum building blocks in an array), multiple buses connecting the qubits, and N number of connectors (for example, two connectors for each qubit –N=2×L) for connecting to qubits of an adjacent quantum building block.

Such quantum device has an advantage of providing an ability to interconnect most if not all qubits and providing an option of adding or removing one or more quantum building blocks to and from the modular array of quantum building blocks. Such quantum device can also have an advantage of providing an ability to replace a single quantum building block or rearrange one or more quantum building blocks without replacing the entire device. Yet another advantage of using quantum building blocks for the quantum device is that it allows for determining frequency of qubits of a single quantum building block prior to long term installation. This advantage extends to an ability to organize quantum building blocks in an array to avoid frequency collision. Additionally, the subject quantum device can provide an ability to replace a quantum building block with deteriorating qubit(s) without having to replace the entire quantum device.

Figure 1:
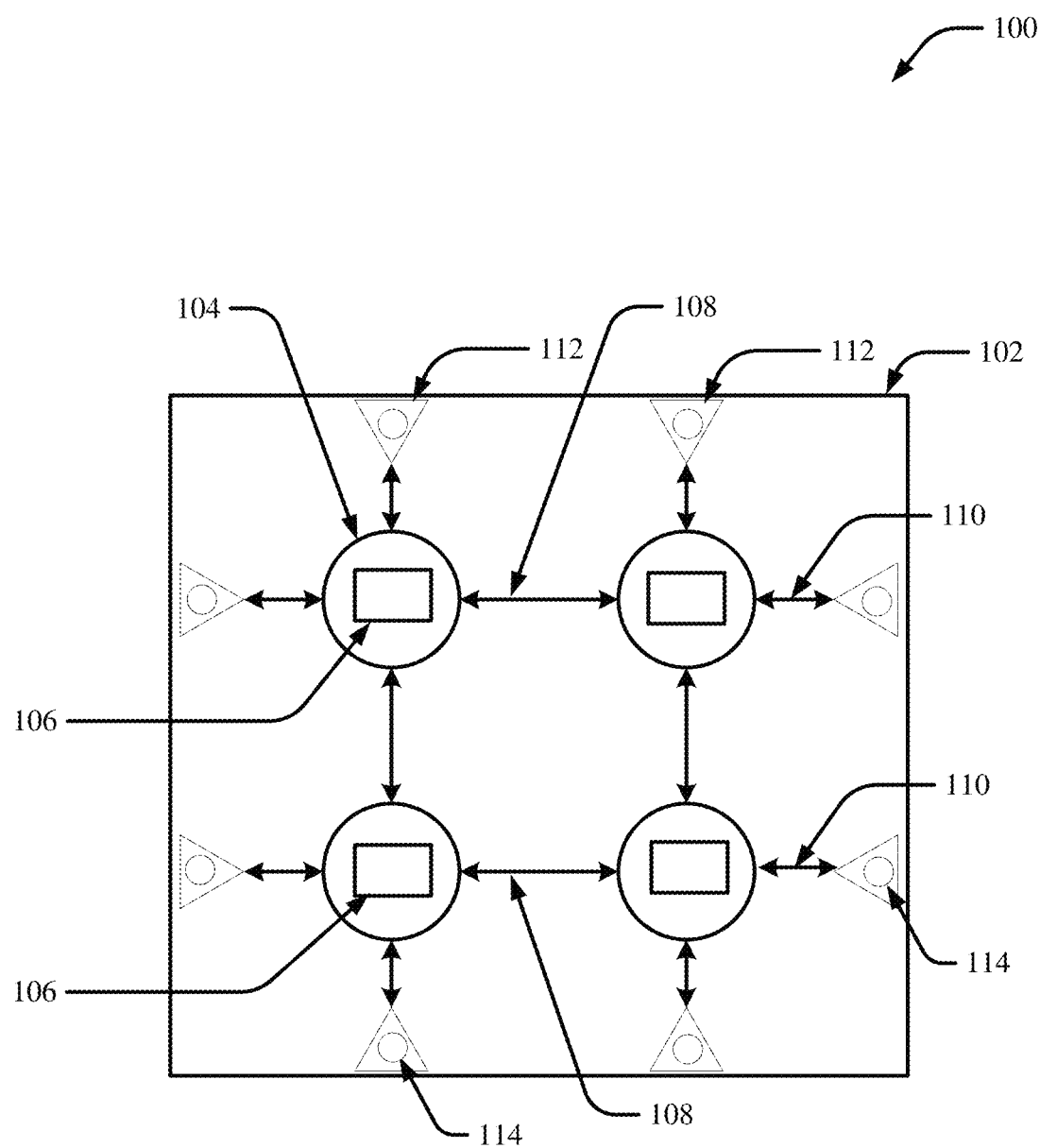
FIG. 1 illustrates an example, non-limiting quantum building block in accordance with one or more embodiments described herein.

FIG. 1 illustrates an example, non-limiting quantum building block 100 in accordance with one or more embodiments described herein. The quantum building block 100 comprises a substrate 102, a plurality of qubit pockets 104, a plurality of transmission lines (e.g., buses) 108 and 110, and a plurality of connectors 112 having a connecting element 114. As a non-limiting example, the quantum building block 100 illustrated comprises four qubit pockets 104 that receives four qubits 106, respectively. It is to be appreciated that any suitable number of qubit pockets can be employed. The qubit pockets 104 are positioned on the substrate 102 such that a particular qubit pocket is connected to two other adjacent qubit pockets by transmission lines 108. For example, qubit pockets 104 are a region of space where a set of qubits 106 are implemented. In addition, as an example, two connectors 112 are positioned on each side of the substrate 102, wherein the connectors 112 are connected to the particular qubit pocket 104 through transmission line 110.

In an embodiment, the substrate 102 may be made of a dielectric material, such as sapphire, silicon and gallium arsenide. Portions of the substrate 102 is allocated for providing the set of qubit pockets 104, which are region of space on the substrate 102 for implementing the set of qubits 106. In some embodiments, junction devices (e.g., Josephson junction, not shown) can be used by the set of qubit pockets 104 to implement the set of qubits 106, respectively.

In an embodiment, the transmission lines 108 and 110 carry qubit information such as quantum signals. In an embodiment, the transmission lines 108 and 110 can be made of coplanar waveguide. In some embodiments, the transmission lines 108 and 110 can be made using strip-line, microstrip or other superconducting material that can carry or transport quantum signals. In some embodiments, the transmission lines 108 connect adjacent qubit pockets (e.g., vertically and horizontally adjacent qubit pockets; also referred to as neighboring qubit pockets). In some embodiments, the transmission lines 110 connect the plurality of qubit pockets 104 to plurality of connectors 112. In embodiment, the transmission lines 110 comprises resonators (not shown) for controlling resistivity of qubits 106 coupled to the plurality of qubit pockets 104.

In an embodiment, the plurality of connectors 112 are positioned around the substrate 102. The plurality of connectors 112 comprise connecting element 114, respectively (e.g., one connecting element 114 for one connector 112). The plurality of connectors 112 are used to connect the quantum building block 100 to other quantum building blocks to produce an array of modular quantum building blocks (shown in FIGS. 2 and 3). In some embodiments, the plurality of connectors 112 can electrically connect to other components of a quantum computer (e.g., the edge of the quantum device). In an embodiment, the connectors 112 are arranged with a separation gap (discussed in FIG. 2) to keep crosstalk between connecting elements 114 below −50 decibels.

Figures 2A, 2B:
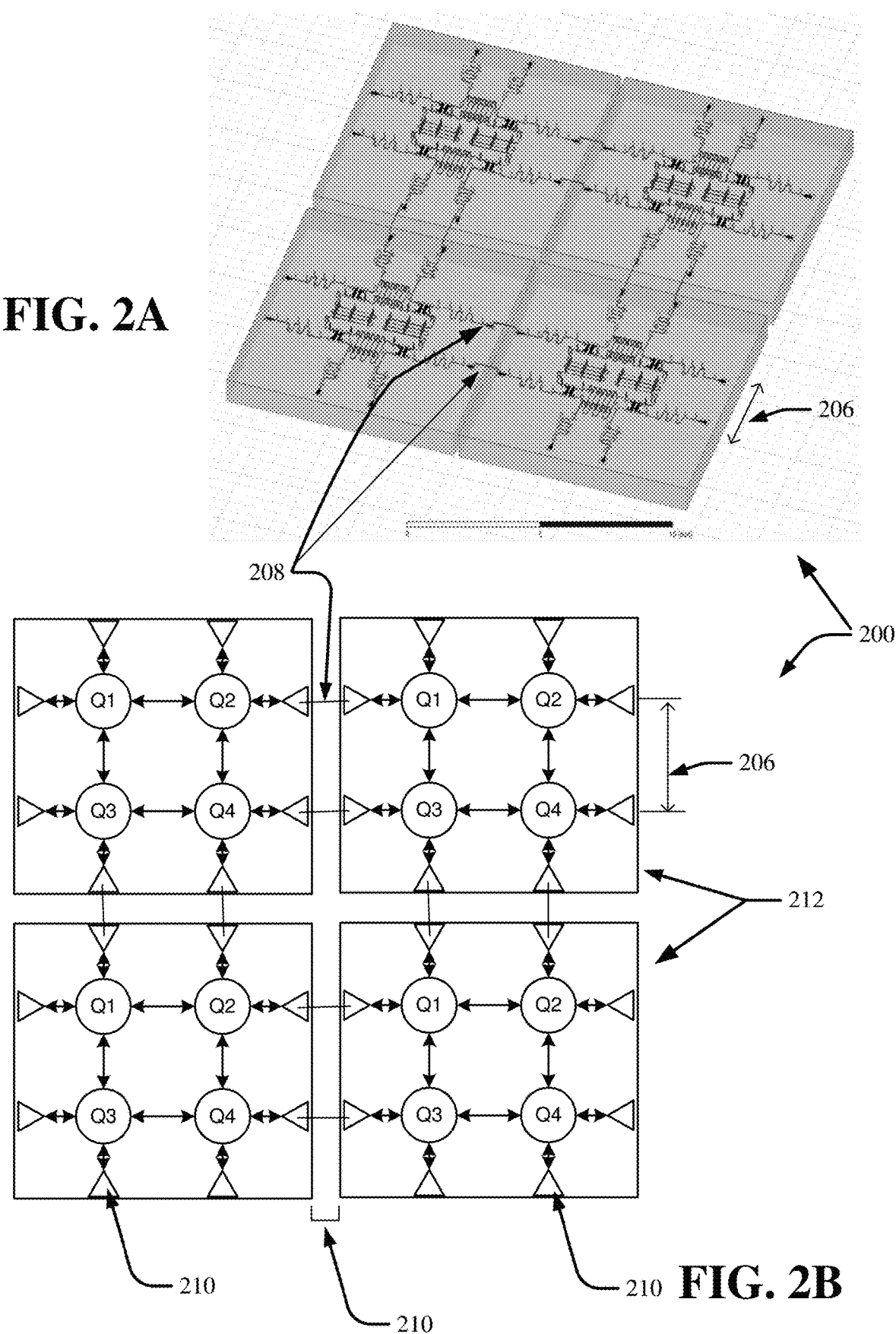
FIGS. 2A and 2B illustrate an example, non-limiting quantum device in accordance with one or more embodiments described herein.

An advantage of using the quantum building block 100 is that it provides the ability to use a different substrate 102 for the array of quantum building blocks (e.g., the quantum device may comprise substrate made from different materials or comprise different number of components). Using a different substrate 102 for each quantum building block provides an ability to mitigate qubit frequency collision. Also, frequency collision can be mitigated by building block arrangements discussed in FIGS. 2B, 3A and 3B below. For example, arranging multiple building blocks like a jigsaw puzzle. As shown in FIG. 2B, building blocks with same qubit frequencies can be connected as long as qubits with the same frequencies are not connected to each other. Qubits with same frequency separated by other qubits (e.g., not directly connected by the transmission lines) can be used by the quantum processor. For example, selecting different set of frequencies for qubits 106 coupled to the substrate 102. Another advantage of using different substrate 102 for each quantum building block 100 is that the quantum building block 100 can be swapped out and replaced with another quantum building block 102 from an array of quantum building blocks. Thus, when the qubit 106 deteriorate, the modular quantum building block 102 containing the deteriorating qubit can be swapped out and replaced without having to replace the entire quantum device.

FIGS. 2A and 2B illustrates an example, non-limiting quantum device 200 in accordance with one or more embodiments described herein. Repetitive description of like elements employed in respective embodiments is omitted for sake of brevity. In some embodiments, the quantum device 200 comprises an array of quantum building blocks 212 (e.g., 100 of FIG. 1). In an exemplary illustration, four quantum building blocks 212 for the quantum device 200 are illustrated for simplicity (e.g., a grid of 2×2 quantum building blocks 212). The quantum building blocks 212 are connected using one or more connecting elements 208 (e.g. 114 of FIG. 1). The connecting elements 208 can carry quantum signals that electrically couple the adjacent quantum building blocks 202. In an embodiment, connecting elements 208 are wire bonds capable of carrying quantum signals. In another embodiment, connecting elements 208 is vertical interconnect accesses capable of carrying quantum signals. To keep the crosstalk between the connecting elements 208 below a threshold (e.g., −50 decibels), a separation gap 206 is provided. In one or more embodiments, the separation gap 206 is at least 3 millimeters (mm). In some embodiments, the crosstalk between the connecting elements 208 is maintained below the threshold by adjusting amount of or type of materials used to make the substrate 102, adjusting separation gap 210 between the quantum building blocks 212 or resistivity levels of qubits.

Figure 3A:
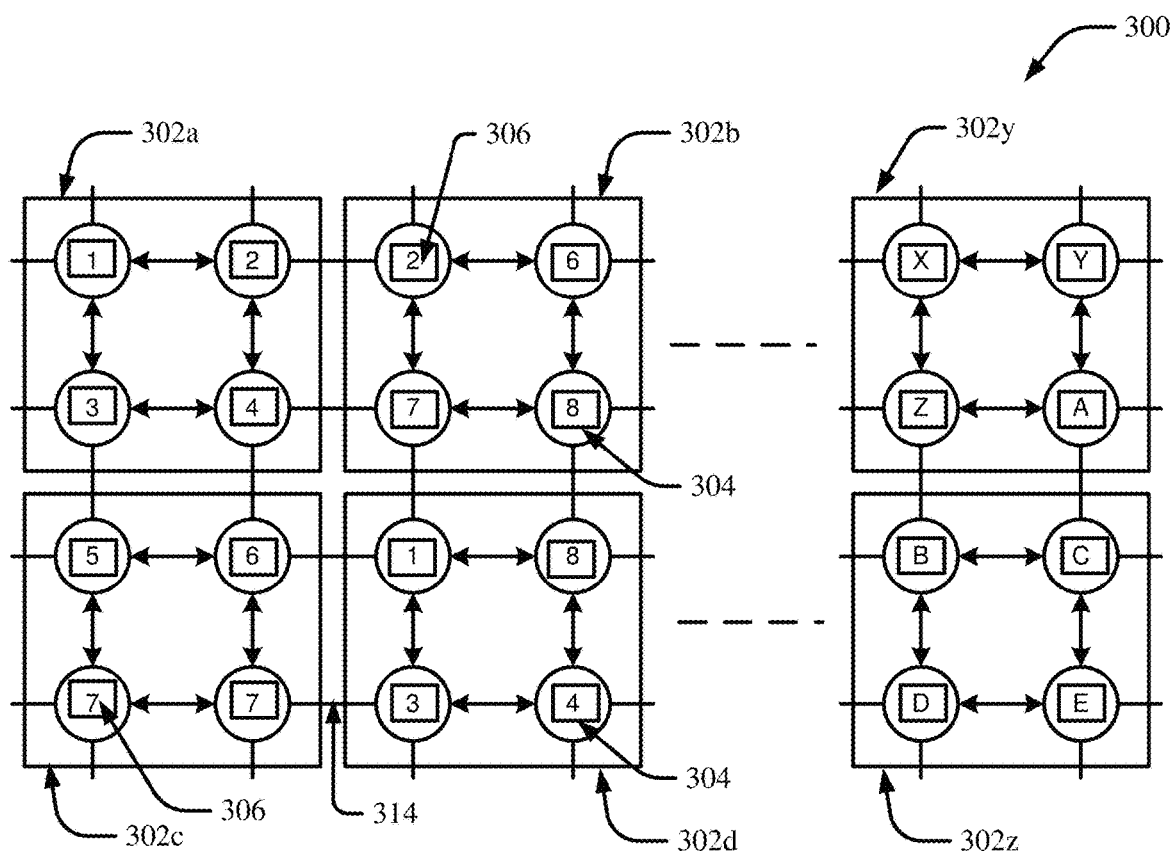
FIGS. 3A and 3B illustrate an example, non-limiting quantum device structure in accordance with one or more embodiments described herein.
Figure 3B:
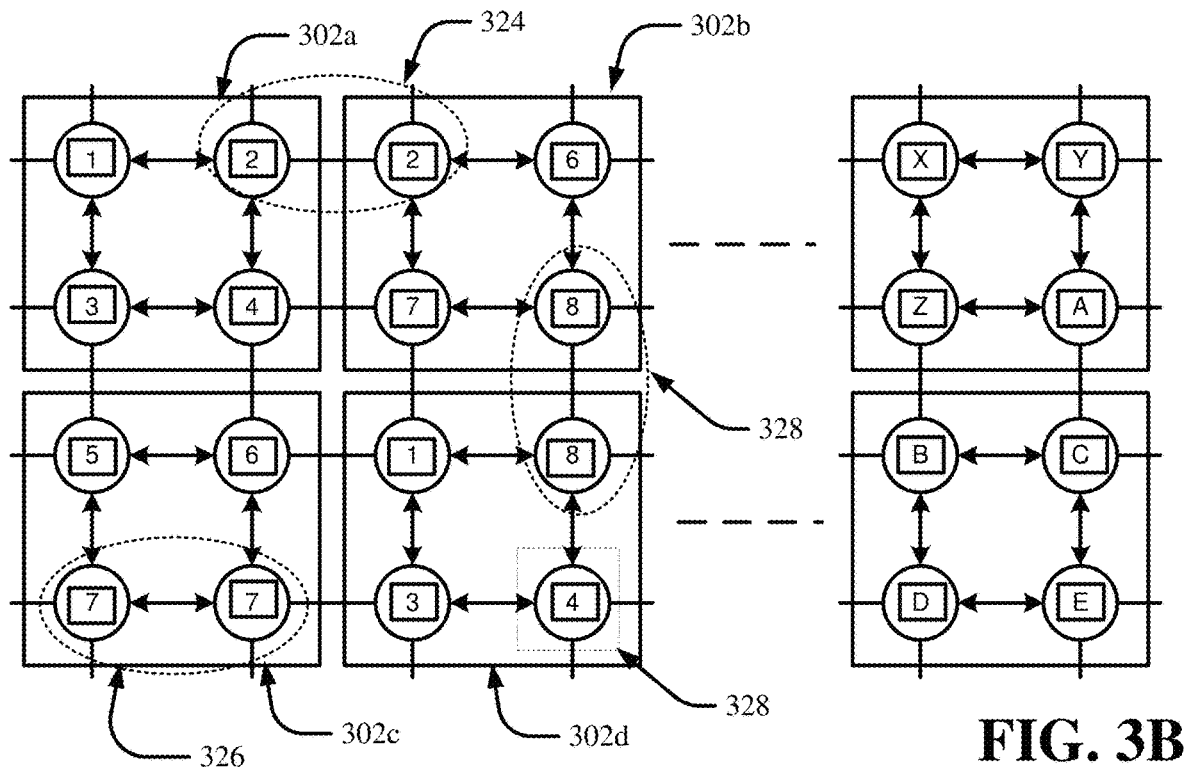

FIGS. 3A and 3B illustrates an example, non-limiting quantum device structure 300 in accordance with one or more embodiments described herein. Repetitive description of like elements employed in respective embodiments is omitted for sake of brevity. According to several embodiments, the structure 300 can comprise a plurality of quantum building blocks 302*a-z* (e.g., 100 of FIG. 1) wherein the quantum building blocks 302*a-z* are connected by connecting elements 314 (e.g., 114 of FIG. 1).

In some embodiments, a qubit 304 communicates information at a frequency, illustrated by a communication frequency number at 306. In some implementation, once the quantum building block is assembled (e.g., once all the components, including the qubits 304, are secured to the quantum building blocks 302), a resistivity level of each qubit 304 is determined. Various factors can impact the resistivity level of a qubit 304. For example, the type of substrate 102 (e.g., silicon, sapphire, etc.), the material used for transmission lines 106 and 108 (coplanar waveguide, microstrip, etc.), and the amount of resonant used for transmission line 108. Using the resistivity level of the qubit 304, the communication frequency of the qubit 304 can be determined. For sake of clarity and so as not obscure FIG. 3, the communication frequency numbers are shown for all other qubits of an exemplary device structure 300 without repetitive description of how the frequency was allocated for each qubit.

As illustrated in FIG. 3B, for example, once the communication frequencies of the plurality of qubits are determined, frequency collision between adjacent qubits can be determined, if any. For illustration, frequency collisions are identified at 324, 326 and 328, wherein communication frequencies of two adjacent qubits is identical. In some embodiments, one or more quantum building blocks impacted by the frequency collision can be replaced, such that frequency collision does not occur between adjacent qubits 304. As illustrated, the quantum building blocks 302*a* and 302*b* are impacted by frequency collisions, at 324. Thus, either one or both quantum building blocks 302*a* and 302*b*, can be replaced with another quantum building block, such that in the new arrangement of the quantum device 300, communication frequencies of adjacent qubits do not collide. Similarly, if only one quantum building block is impacted by frequency collision at 326, the impacted quantum building block 302*c* can be replaced with another quantum building block, such that in the new arrangement of the quantum device 300, communication frequencies of adjacent qubits do not collide.

Also, for example, illustrated at 328 is a deteriorating qubit 304 that impacts performance of the quantum building block 302*d*. In some implementations, once determined that a quantum building block 302*d* contains a deteriorating qubit 304, the impacted quantum building block 302*d* can be replaced with another quantum building block, such that in the new arrangement of the quantum device 300, communication frequencies of adjacent qubits do not collide. The advantage of using the quantum device 300 according to one or more embodiments is that only the impacted quantum building blocks needs to be replaced.

Figure 4B:
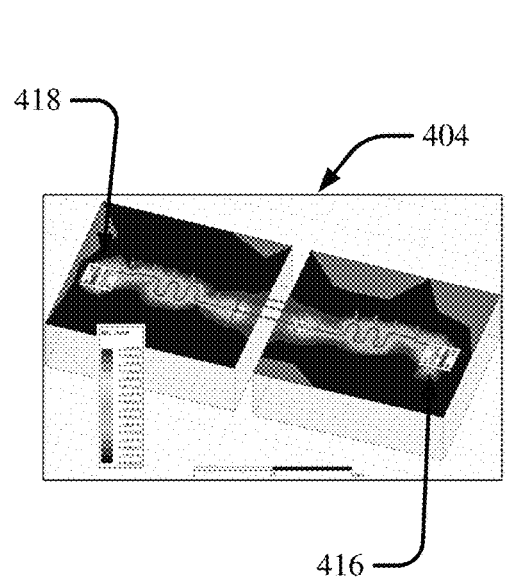
FIGS. 4A, 4B and 4C illustrate example, non-limiting simulation data from testing of a quantum device in accordance with one or more embodiments described herein.
Figure 4A:
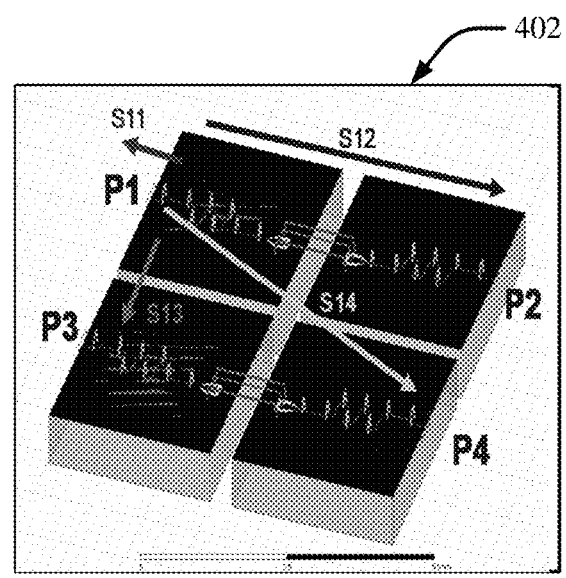
Figure 4C:
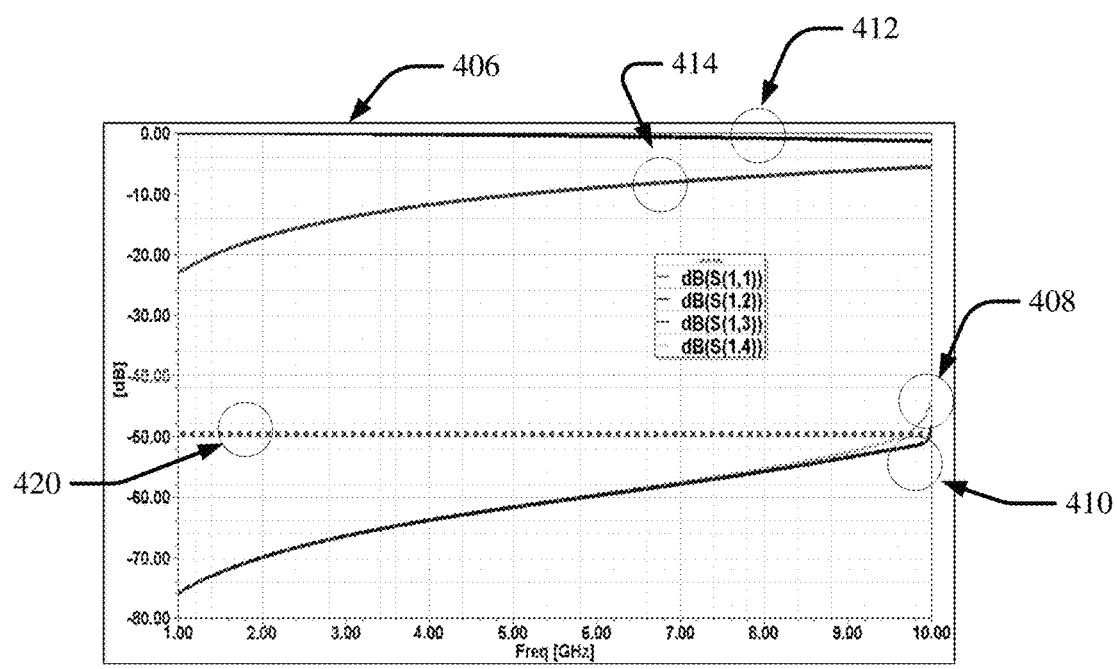

FIGS. 4A, 4B and 4C illustrate an example, non-limiting simulation data from testing of the quantum device 402 in accordance with one or more embodiments described herein. FIG. 4A illustrates a quantum device 402, comprising four building blocks with a 3*mm* distance between wire bonds, and physical location of four (P1, P2, P3 and P4) connectors (212 of FIG. 2). FIG. 4B illustrates ports 416 and 418 of adjacent quantum building blocks. FIG. 4C illustrates results, at chart 406, from testing crosstalk levels between certain ports shown in FIGS. 4A and 4B. There are specific simulations taken to test crosstalk between different ports. Line 408 illustrates crosstalk levels between ports P1 and P4 (FIG. 4A). Line 410 illustrates crosstalk levels between ports P1 and P3 (FIG. 4A). Line 412 illustrates crosstalk levels between ports P1 and P2 (FIG. 4A). Line 414 illustrates crosstalk levels between ports 416 and 418. Line 420 illustrates ideal crosstalk (e.g., −50 dB) threshold for a modular quantum device with two-dimensional grid.

Line 408 focuses on determining crosstalk between a qubit (206 of FIG. 1) placed at port P1 and at port P4. The crosstalk is below −50 dB, which is deemed acceptable crosstalk between two qubits placed diagonal to each other on different quantum building blocks. Line 410 focuses on determining crosstalk between a qubit placed at port P1 and at port P3. The crosstalk is below −50 dB, which is deemed acceptable crosstalk between two qubits placed vertical to each other on different quantum building blocks. Line 412 focuses on determining communication between a qubit placed at port P1 and at port P2. The communication is flat across the spectrum at or near 0 dB, which is deemed acceptable between two qubits placed horizontally to each other on different quantum building blocks. Line 414 is the reflection coefficient and focuses on the amount of signal going back to the qubit at port P1. A reflection coefficient is below 0 dB, which is deemed acceptable.

Figure 5:
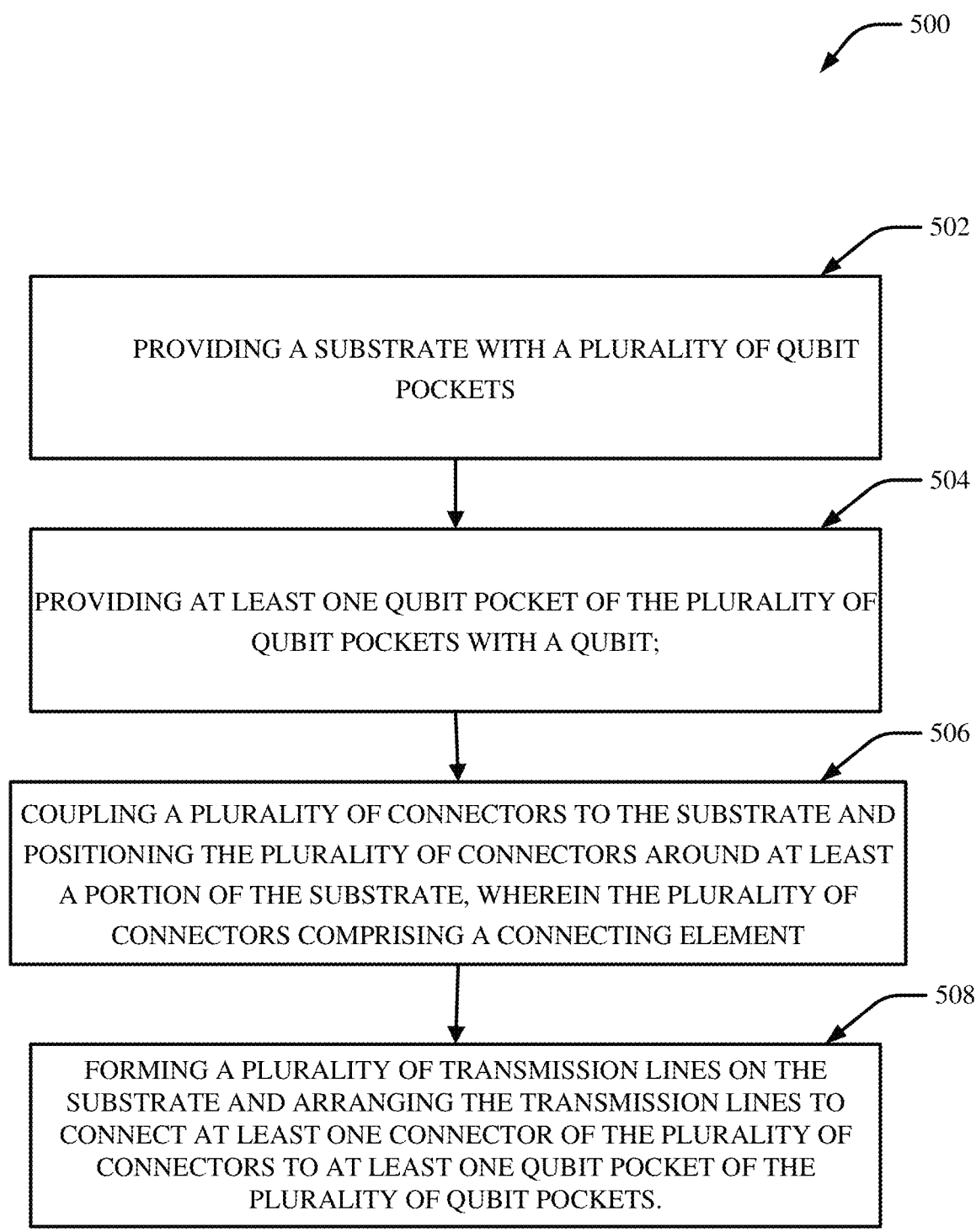
FIG. 5 illustrates a flow diagram of an example, non-limiting computer-implemented method that facilitates implementing a quantum building block in accordance with one or more embodiments described herein.
Figure 8:
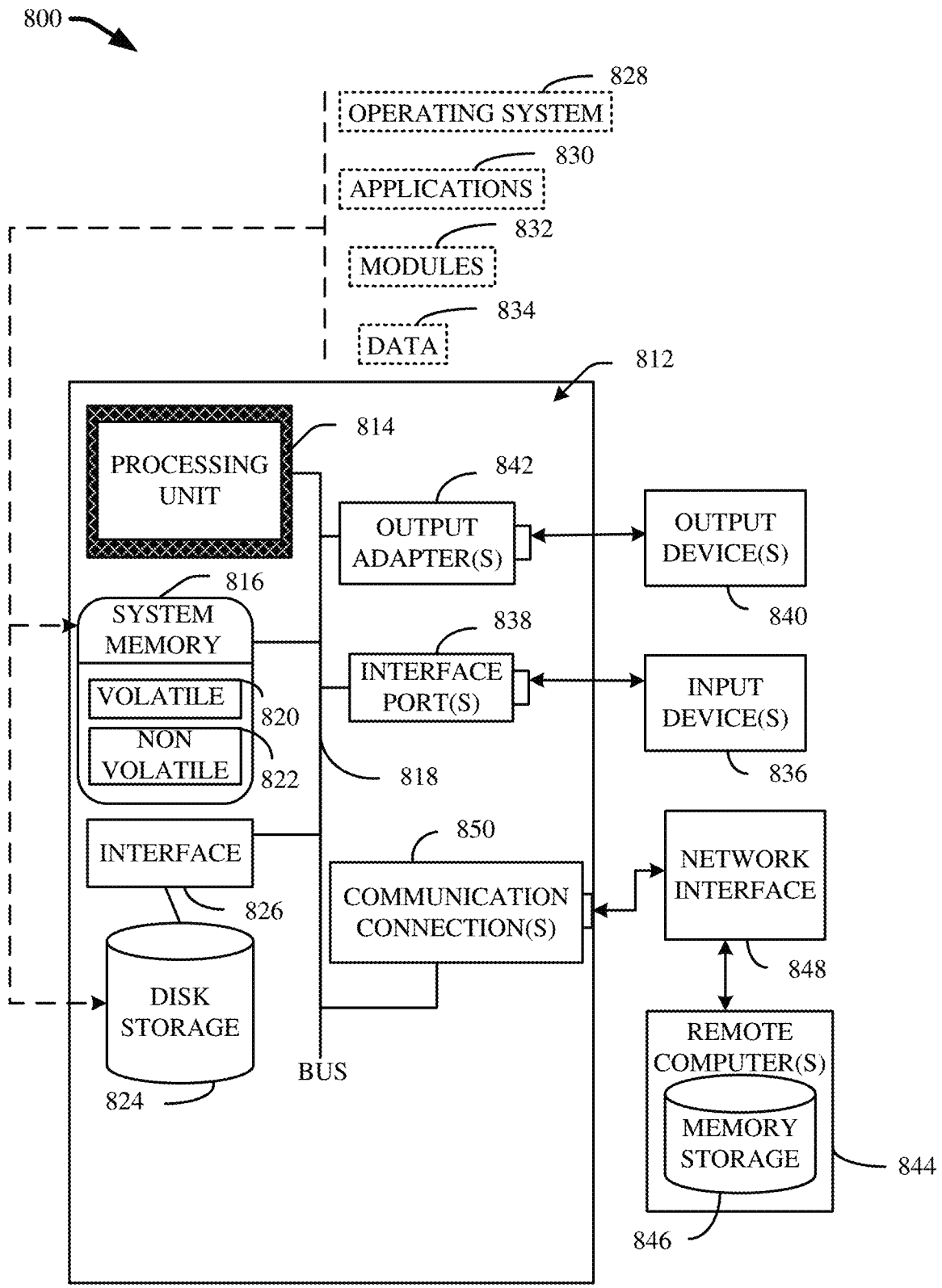
FIG. 8 is a schematic diagram of an example operating environment in accordance with one or more implementations described herein.

FIG. 5 illustrates a flow diagram of an example, non-limiting computer-implemented method that facilitates implementing a quantum building block 100 (FIG. 1) in accordance with one or more embodiments described herein. In some examples, flow diagram 500 can be implemented by operating environment 800 (FIG. 8). It can be appreciated that the operations of flow diagram 500 can be implemented in a different order than is depicted. It can also be appreciated that the operations of flow diagram 500 can be implemented in a different order than is depicted.

In non-limiting example embodiments, a computing device (or system) (e.g., computer 812 (FIG. 8)) is provided comprising one or more processors and one or more memories that stores executable instructions that, when executed by the one or more processors, can facilitate performance of the operations as described herein, including the non-limiting methods as illustrated in the flow diagrams of FIG. 5. As a non-limiting example, the one or more processors can facilitate performance of the methods by directing or controlling one or more equipment operable to perform semiconductor fabrication.

Operation 502 depicts coupling (e.g., by computer 812) a substrate 102 (FIG. 1) with plurality of qubit pockets 104 (FIG. 1). Operation 504 depicts coupling (e.g., by computer 812) at least one qubit pocket of the plurality of qubit pockets 104 with a qubit 106 (FIG. 1). Operation 506 depicts coupling (e.g., by computer 812) a plurality of connectors 112 (FIG. 1) to the substrate 102 and positioning the plurality of connectors 112 around at least a portion of the substrate 102, wherein the plurality of connectors 112 comprising a connecting element 114 (e.g., the connecting element received the wire bond that connects two quantum building blocks). Operation 508 depicts forming (e.g., by computer 812) a plurality of transmission lines 108 and 110 (FIG. 1) on the substrate 106 and arranging the transmission lines 108 and 110 to connect at least one connector of the plurality of connectors 112 to at least one qubit pocket of the plurality of qubit pocket. In some examples of operation 508, the transmission lines 108 connect all adjacent qubit pockets of the plurality of qubit pockets 104.

Figure 6:
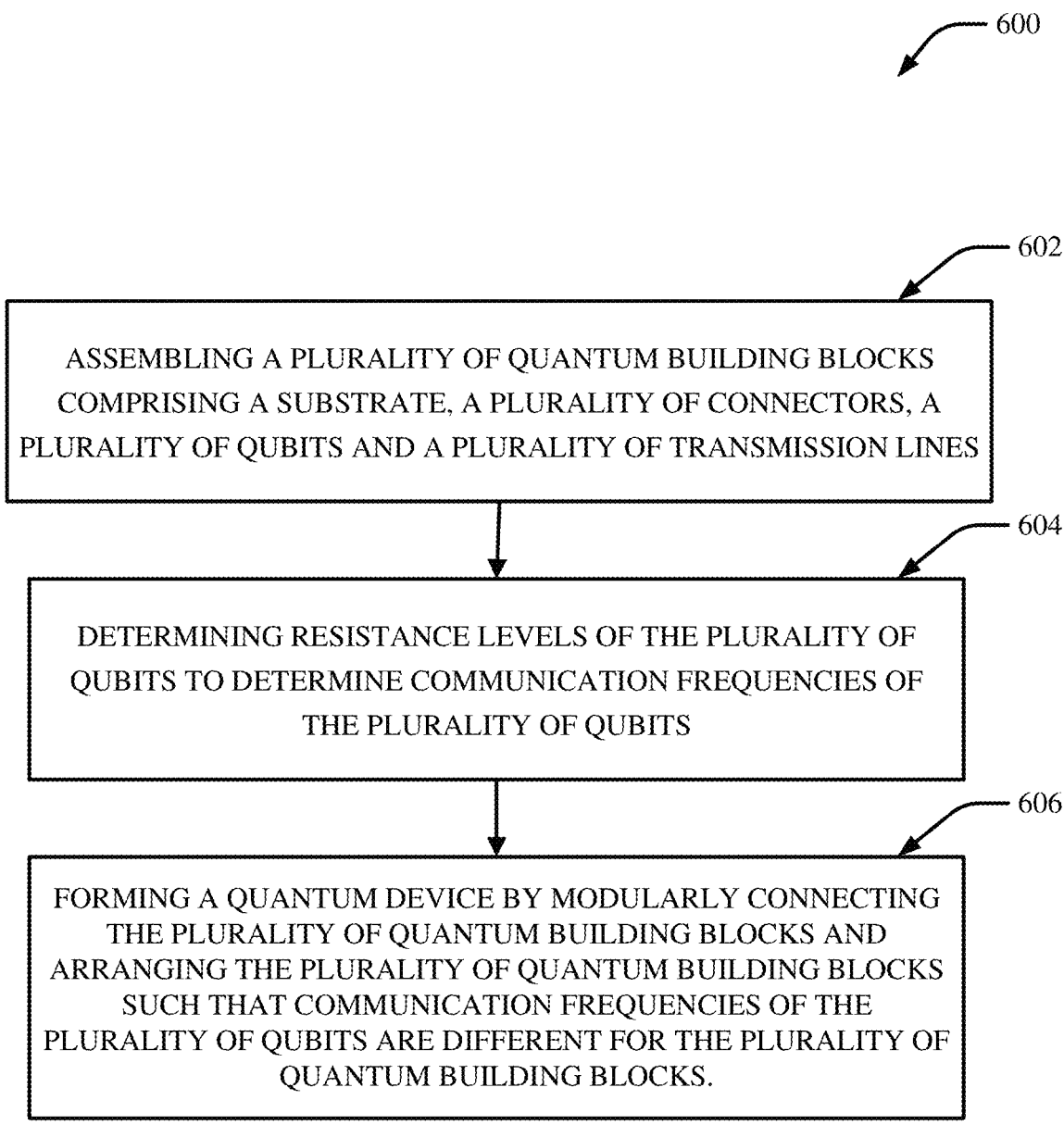
FIG. 6 illustrates a flow diagram of an example, non-limiting computer-implemented method that facilitates implementing a quantum device with quantum building blocks in accordance with one or more embodiments described herein.

FIG. 6 illustrates a flow diagram of an example, non-limiting computer-implemented method that facilitates implementing a quantum device 300 (FIG. 3) with quantum building blocks 302*a-d* (FIG. 3) in accordance with one or more embodiments described herein. In some examples, flow diagram 600 can be implemented by operating environment 800. It can be appreciated that the operations of flow diagram 600 can be implemented in a different order than is depicted. It can also be appreciated that the operations of flow diagram 600 can be implemented in a different order than is depicted.

In non-limiting example embodiments, a computing device (or system) (e.g., computer 812) is provided comprising one or more processors and one or more memories that stores executable instructions that, when executed by the one or more processors, can facilitate performance of the operations as described herein, including the non-limiting methods as illustrated in the flow diagrams of FIG. 6. As a non-limiting example, the one or more processors can facilitate performance of the methods by directing or controlling one or more equipment operable to perform semiconductor fabrication.

Operation 602 depicts coupling (e.g., by computer 812) assembling a plurality of quantum building blocks 302a-d (FIG. 3) comprising a substrate 102 (FIG. 1), a plurality of connectors 112 (FIG. 1), a plurality of qubits 106 (FIG. 1) and a plurality of transmission lines 108 and 110 (FIG. 1). Operation 604 depicts determining (e.g., by computer 812) resistance levels of the plurality of qubits to determine communication frequencies 306 (FIG. 3A) of the plurality of qubits 106 (FIG. 1). Operation 606 depicts forming (e.g., by computer 812) a quantum device 300 by modularly connecting the plurality of quantum building blocks 302a-d and arranging the plurality of quantum building blocks 302a-d such that communication frequencies 306 of the plurality of qubits 106 are different for the plurality of quantum building blocks 302a-d.

Figure 7:
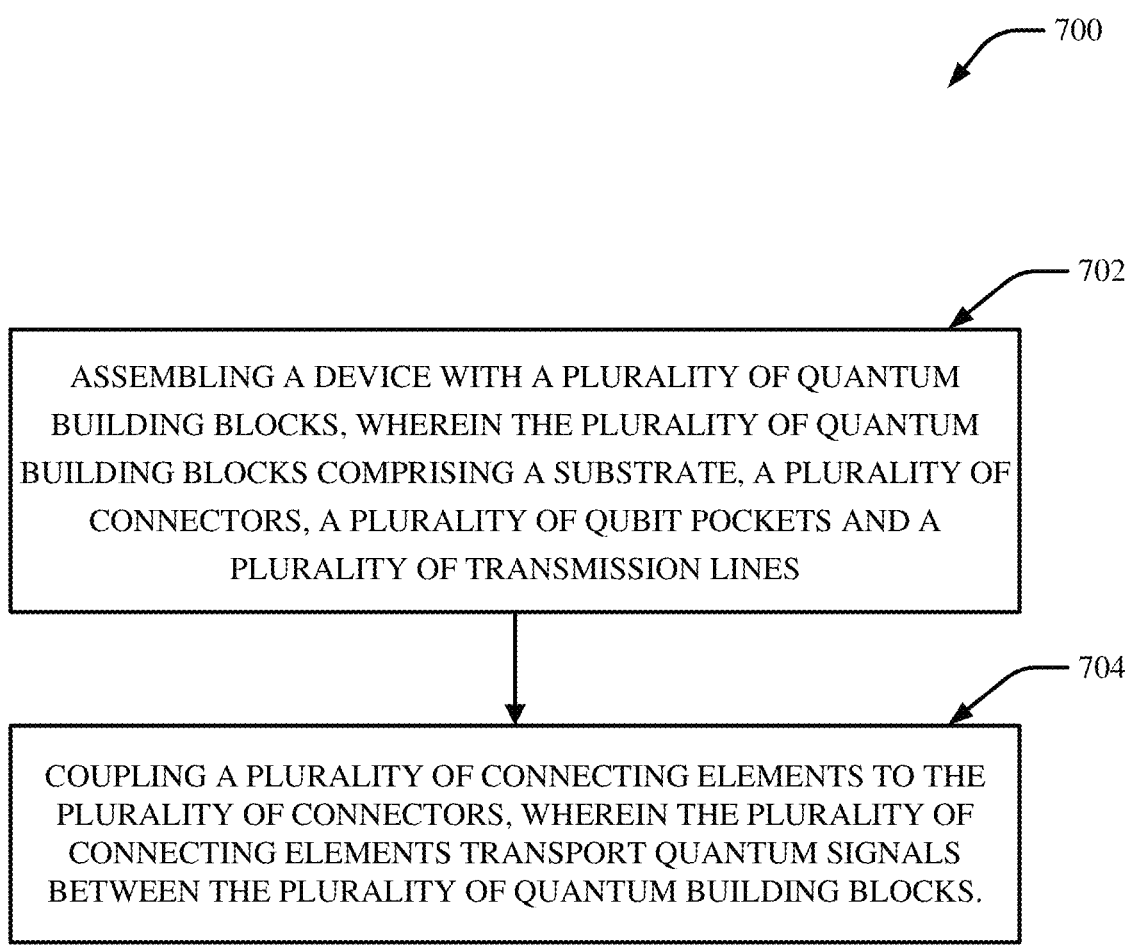
FIG. 7 illustrates a flow diagram of an example, non-limiting computer-implemented method that facilitates implementing a quantum device with quantum building blocks in accordance with one or more embodiments described herein.

FIG. 7 illustrates a flow diagram of an example, non-limiting computer-implemented method that facilitates implementing a quantum device 300 (FIG. 3) with quantum building blocks 302a-d (FIG. 3) in accordance with one or more embodiments described herein. In some examples, flow diagram 700 can be implemented by operating environment 800. It can be appreciated that the operations of flow diagram 700 can be implemented in a different order than is depicted. It can also be appreciated that the operations of flow diagram 700 can be implemented in a different order than is depicted.

In non-limiting example embodiments, a computing device (or system) (e.g., computer 812) is provided comprising one or more processors and one or more memories that stores executable instructions that, when executed by the one or more processors, can facilitate performance of the operations as described herein, including the non-limiting methods as illustrated in the flow diagrams of FIG. 7. As a non-limiting example, the one or more processors can facilitate performance of the methods by directing or controlling one or more equipment operable to perform semiconductor fabrication.

Operation 702 depicts assembling (e.g., by computer 812) a device with a plurality of quantum building blocks 302a-d (FIG. 3), wherein the plurality of quantum building blocks comprising a substrate 102, a plurality of connectors 112, a plurality of qubit pockets 104 and a plurality of transmission lines 108 and 110. Operation 704 depicts coupling (e.g., by computer 812) a plurality of connecting elements 114 to the plurality of connectors 112, wherein the plurality of connecting elements 114 transport quantum signals between the plurality of quantum building blocks 402a-d.

To provide context for the various aspects of the disclosed subject matter, FIG. 8 as well as the following discussion are intended to provide a general description of a suitable environment in which the various aspects of the disclosed subject matter can be implemented. FIG. 8 illustrates a block diagram of an example, non-limiting operating environment in which one or more embodiments described herein can be facilitated. Repetitive description of like elements employed in other embodiments described herein is omitted for sake of brevity.

A suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 894), and Small Computer Systems Interface (SCSI). The system memory 816 can also include volatile memory 820 and nonvolatile memory 822. The basic input/output system (BIOS), containing the basic routines to transfer information between elements within the computer 812, such as during start-up, is stored in nonvolatile memory 822. By way of illustration, and not limitation, nonvolatile memory 822 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 820 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 824 to the system bus 818, a removable or non-removable interface is typically used, such as interface 826. FIG. 8 also depicts software that acts as an intermediary between users and the basic computer resources described in the suitable operating environment 801. Such software can also include, for example, an operating system 828. Operating system 828, which can be stored on disk storage 824, acts to control and allocate resources of the computer 812. System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor based appliance, a peer device or other common network node and the like, and typically can also include many or all the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Embodiments of the present innovation may be a system, a method, an apparatus and/or a computer program product at any possible technical detail level of integration. The computer program product can include a computer readable storage medium (or media) having computer readable program instructions thereon for causing a processor to carry out aspects of the present innovation. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present innovation can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, to perform aspects of the present innovation.

Aspects of the present innovation are described herein with reference to flowchart illustrations and/or block diagrams of methods, apparatus (systems), and computer program products according to embodiments of the innovation. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present innovation. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that executes on a computer and/or computer, those skilled in the art will recognize that this disclosure also can or can be implemented in combination with other program modules. Generally, program modules include routines, programs, components, data structures, etc. that perform tasks and/or implement abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products, and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a plurality of substrates, each of the plurality of substrates having a plurality of qubit pockets, wherein at least one qubit pocket of the plurality of qubit pockets is provided with a qubit of a plurality of qubits in the respective plurality of qubit pockets;
   a plurality of connectors directly connected between at least two of the plurality of substrates and positioned around an edge of the at least two of the plurality of substrates, the plurality of connectors comprising respective connecting elements, wherein each of the respective connecting elements directly connects the at least two of the plurality of substrates; and
   a plurality of transmission lines formed on the substrate and connected to at least one connector of the plurality of connectors and to at least one qubit pocket of the plurality of qubit pockets, and wherein the plurality of substrates are separate from one another rendering the device a modular quantum device in which the qubit is separately replaceable from other ones of the plurality of qubits without replacement of the entire device.

2. The device of claim 1, wherein the respective connecting elements are arranged on the at least one of the plurality of substrates with a separation gap between the respective connecting elements of at least 3 millimeters and wherein the separation gap is disposed to maintain crosstalk below −50 decibels.

3. The device of claim 1, wherein the respective connecting elements comprise wire bonds.

4. The device of claim 1, wherein the respective connecting elements comprise vertical interconnect accesses.

5. The device of claim 1, wherein the at least one of the plurality of substrates is composed of a material selected from the group consisting of Sapphire and Silicon and Gallium Arsenide.

6. The device of claim 1, wherein at least one transmission line of the plurality of transmission lines is a coplanar waveguide.

7. The device of claim 1, wherein at least one transmission line of the plurality of transmission lines is comprised of a microstrip material.

8. The device of claim 1, wherein at least one qubit pocket of the plurality of qubit pockets is coupled to the substrate using a coplanar waveguide, and wherein adjacent ones of the plurality of qubit pockets are vertically adjacent.

9. The device of claim 1, wherein the plurality of substrates comprises at least four substrates, wherein each of the four substrates is positioned having at least one edge adjacent to an edge of another one of the four substrates to form the modular quantum device in the shape of a four-sided polygon, and wherein each of the four substrates comprises a plurality of connectors directly connecting each of the four substrates to another one of the four substrates.

10. A structure, comprising:
    a device comprising a plurality of quantum building blocks, wherein the plurality of quantum building blocks comprise a respective plurality of substrates, a plurality of connectors directly connected between at least two of the plurality of substrates, a plurality of qubit pockets and a plurality of transmission lines; and a plurality of connecting elements coupled to the plurality of connectors, wherein the plurality of connecting elements transport quantum signals between the plurality of quantum building blocks, wherein each of the plurality of connecting elements directly connects at least two of the plurality of substrates, and wherein the respective plurality of substrates are separate from one another rendering the structure a modular quantum structure in which a substrate of the plurality of substrates is separately detachable from other ones of the plurality of substrates without replacement of the entire structure.

11. The structure of claim 10, wherein at least one qubit pocket of the plurality of qubit pockets is coupled with a qubit.

12. The structure of claim 10, wherein the plurality of connecting elements are arranged with a separation gap between the plurality of connecting elements to maintain crosstalk below −50 decibels.

* * * * *